USA United States Patent [19]

Yoneda et al.

[11] Patent Number: 4,906,594

[45] Date of Patent: Mar. 6, 1990

[54] SURFACE SMOOTHING METHOD AND METHOD OF FORMING SOI SUBSTRATE USING THE SURFACE SMOOTHING METHOD

[75] Inventors: Kiyoshi Yoneda, Hirakata; Kazunobu Mameno, Kyoto; Keita Kawahara, Nagaokakyo; Yasunori Inoue, Osaka, all of Japan

[73] Assignee: Agency of Industrial Science and Technology, Tokyo, Japan

[21] Appl. No.: 195,124

[22] Filed: May 16, 1988

[30] Foreign Application Priority Data

Jun. 12, 1987 [JP] Japan .................................. 62-145244
Nov. 25, 1987 [JP] Japan .................................. 62-295379

[51] Int. Cl.$^4$ ...................... H01L 21/306; B44C 1/22; C03C 15/00; C03C 25/06
[52] U.S. Cl. .................................... 437/228; 437/231; 437/247; 156/640; 156/643; 204/192.34; 204/192.35
[58] Field of Search ............... 437/228, 231, 247; 156/640, 643; 204/192.34, 192.35

[56] References Cited

U.S. PATENT DOCUMENTS

| | | | |
|---|---|---|---|
| 3,860,783 | 1/1975 | Schmidt et al. | 204/192.34 |
| 4,092,210 | 5/1978 | Hoepfner | 204/192.34 |
| 4,214,966 | 7/1980 | Mahoney | 204/192.34 |
| 4,444,616 | 4/1984 | Fujita et al. | 156/628 |
| 4,460,434 | 7/1984 | Johnson et al. | 156/643 |
| 4,604,176 | 8/1986 | Paul | 204/192.34 |
| 4,662,985 | 5/1987 | Yoshida et al. | 156/643 |
| 4,690,746 | 9/1987 | McInerney et al. | 204/192.32 |

Primary Examiner—Olik Chaudhuri
Attorney, Agent, or Firm—Darby & Darby

[57] ABSTRACT

This invention relates to a surface smoothing method for smoothing the surface of a semiconductor film and insulating film, etc, and a method of forming and SOI substrate by using this surface smoothing method. In this surface smoothing method, the surface of a semiconductor film or an insulating film formed on a substrate is irradiated with an ion beam at an incident angle of about 85° or more, to the normal direction of the surface, while revolving the substrate, whereby the surface is smoothed easily without any contamination thereof or physical deformation of the surface layer. When this surface smoothing method is used in forming an SOI substrate used for a semiconductor three-dimensional circuit element, a single crystal insulating film is formed on a single crystal silicon substrate, and, after annealing, the surface of the insulating film is smoothed by this surface smoothing method and a single crystal silicon film is formed on the smoothed surface thereof, whereby the crystallinity and the surface characteristics of the insulating film are improved and a better quality formed single crystal silicon film is obtained, leading to higher quality of the SOI substrate.

22 Claims, 8 Drawing Sheets

Prior A (a) θ = 60°

$\longleftrightarrow$ 1 μm (b) θ = 85°

$\longleftrightarrow$ 1 μm (c) θ = 87.5°

$\longleftrightarrow$ 1 μm

| EVALUATION | | BEFORE ION BEAM IRRADIATION | AFTER IPON BEAM IRRADIATION |
|---|---|---|---|
| RHEED | |  |  |
| X-RAY DIFFRACTION (FWHM) | | 2080 cps (2.23°) | 1050 cps (2.80°) |
| Mg COMPOSITION (EPMA) | | 37.5% | 33.3% |
| XPS | $AL_{2p}$ | 73.4 eV | 74.0 eV |
| | $Mg_{2p}$ | 49.3 eV | 49.7 eV |
| | $O_{1s}$ | 530.3 eV | 530.8 eV |

1 μm

SURFACE SMOOTHING METHOD AND METHOD OF FORMING SOI SUBSTRATE USING THE SURFACE SMOOTHING METHOD

BACKGROUND OF THE INVENTION

1. Field of the Invention

This invention relates to a surface smoothing method for smoothing the surface of an object such as substrate with a semiconductor film or insulating film formed thereon, and a method of forming an SOI substrate using the surface smoothing method.

2. Description of the Prior Art

To attain high density and high integration of a semiconductor circuit device, the development of a three-dimensional semiconductor circuit device of laminated structure is being promoted, in which the semiconductor devices are incorporated into each semiconductor thin film which is laminated alternately with an insulating film. When manufacturing such three-dimensional semiconductor circuit devices, however, minute irregularities can be produced on the surface of each semiconductor thin film or each insulating film in the intermediate stage of the process. Since such irregularities, if uncorrected, can exert a negative influence upon the quality of the film grown in the process, the surface of the growing film must be smoothed free of irregularities in the process.

The necessity of surface smoothing will now be particularly described with an example of an SOI (Silicon On Insulator) substrate comprising a single crystal insulating film formed on a substrate with a single crystal silicon film epitaxially grown thereon.

The SOI substrate is considered an elementary material for obtaining integrated circuits of excellent characteristics. Particularly, the SOS (Silicon On Sapphire) substrate using sapphire has excellent characteristics such as higher speed owing to decreased floating capacity and higher integration owing to a decreased separating area between elements.

Nevertheless, for the SOS substrate, sapphire is expensive and larger sapphire is unavailable. Therefore, research and development of SOI substrate forming techniques by use of single crystal magnesia spinel (MgO·Al$_2$O$_3$) has gained attention recently.

One well known technique of forming single crystal magnesia spinel film on a single crystal silicon substrate is the vapor-phase epitaxial growth method (hereinafter called VPE method) as described, for example, in Japanese Patent Publication No. 55119-1983 and Japanese Patent Publication No. 55120-1983.

In Extended Abstracts of the 15th Conference on Solid State Devices and Materials, Tokyo, 1983, pages 31-34, is reported an improvement of the gate insulating characteristic of and integrated circuit by the following method: after forming a single crystal magnesia spinel film 2 on a single crystal silicon substrate 1 by the VPE method of MgCl$_2$—Al—HCl—CO$_2$—H$_2$—N$_2$ series, anneal it at 1100° C. in an oxygen atmosphere to form oxidized silicon film 3 by the oxidization of the interface with the magnesia spinel film of the silicon substrate 1. Then, make a single crystal silicon film 4 epitaxially grown on the magnesia spinel film 2. Thus, with the double gate insulating films of the magnesia spinel film 2 and oxidized silicon film 3 formed, improve the dielectric separation characteristic between the silicon substrate 1 and the upper silicon film 4; by using such an SOI substrate, having double gate, improved insulating characteristics of the integrated circuit are achieved.

The change of the crystallinity of the magnesia spinel film 2 when annealed at a high temperature in an oxygen atmosphere about 2 hr. after being formed on the silicon substrate 1 by the VPE method, as described above, is studied by X-ray diffractometry, giving a result as shown in FIG. 2.

FIG. 2 shows the ratio of the X-ray diffraction intensity of (400) magnesia spinel annealed at various temperatures to that of (400) magnesia spinel before annealing. A higher ratio indicates increased crystallinity of the magnesia spinel film 2, and as obvious from FIG. 2, the higher the annealing temperature, the better is the crystallinity of the magnesia spinel film 2.

However, annealing at 1,200° C. roughens the surface of the magnesia spinel film 2, worsening its flatness, as shown by the electron micrograph in FIG. 3, although improving its crystallinity. In addition, the reflected high energy electron beam diffraction pattern in FIG. 4, showing the surface crystalline structure of the magnesia spinel film 2, fails to exhibit an elongated pattern, and the conditions and crystalline structure of the surface of the magnesia spinel film 2 when annealed at 1200° C. are poor. Therefore, the quality of the silicon film 4 epitaxially grown on the magnesia spinel film 2 may be poor.

On the other hand, when annealing at a temperature of 1100° C. or lower, the roughening of the surface of the magnesia spinel film 2 is decreased, but the increase of the crystallinity of the magnesia spinel film 2 is remarkably small in comparison with annealing at 1200° C., as shown in FIG. 2. Thus, the quality of the silicon film 4 epitaxially grown on the magnesia spinel film 2 is not satisfactory.

Therefore, mirror polishing is commonly given to the substrate surface to make it smooth before the process for forming the insulating film or the semiconductor thin film.

However, as a technique for smoothing the surface of the grown film during the process, no effective method has been available so far other than that described above. In the case of a polishing method, the surface of the grown film can be contaminated with the abrasive and a mechanical distortion or a peeling of a film according to the hardness and adhesive strength of the grown film can be caused. In addition, every time polishing is performed, the process must be interrupted to set the wafer to the polishing device, requiring much labor.

SUMMARY OF THE INVENTION

It is an object of the invention to provide a method of readily smoothing the surface of an object by irradiating it with an ion beam at an incident angle of 85° or more to the normal direction of the surface while revolving the object, without contaminating the surface and without any physical deformation such as peeling a surface layer of the object.

A second object of the invention is to provide a method of smoothing the surface layer in a higher degree by making the incident angle 87.5° or more.

A third object of the invention is to provide a method of smoothing the surface uniformly by making at least a turn of the object while irradiating it with ion beam.

The method of forming an SOI substrate according to the invention is, after annealing a single crystal substrate, to smooth the surface of the single crystal insulating film by the above described smoothing method and form a single crystal silicon film on the smoothed single crystal insulating film.

Accordingly, a fourth object of the invention is to provide a method of forming an SOI substrate capable of making the crystallinity and surface characteristics better.

A fifth object of the invention is to provide a method of forming an SOI substrate capable of making the quality of the single crystal film better.

A sixth object of the invention is to provide a method of forming an SOI substrate, capable of making the element characteristics of an integrated circuit better when the SOI substrate is used to form the integrated circuit.

The above and further objects and features of the invention will more fully be apparent from the following detailed description with accompanying drawings.

DESCRIPTION OF THE PREFERRED EMBODIMENTS

Now the invention will be specifically described with reference to embodiments.

Figure 5:
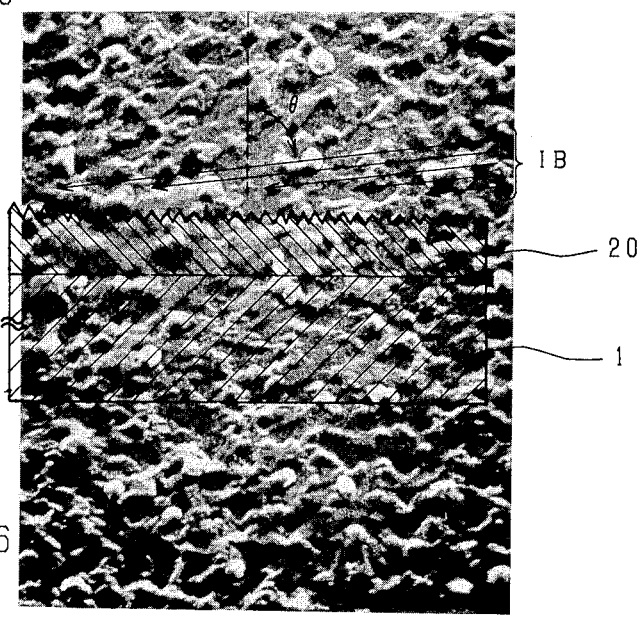
FIG. 5 is a type diagram showing an embodiment of the surface smoothing method according to the invention.
Figure 6:
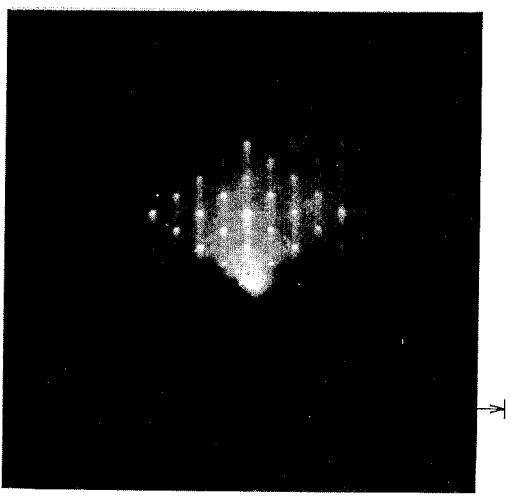
FIG. 6 is an electron micrograph showing the surface condition of a single crystal spinel film which is not irradiated with an ion beam.

FIG. 5 is a type diagram showing an embodiment of the invention, in which 1 represents a single crystal silicon substrate in face orientation (100). A single crystal spinel film 20, formed by the CVD method, is laminated on the single crystal silicon substrate 1. FIG. 6 is an electron micrograph showing the surface condition of the single crystal spinel film 20. A micro-irregularity is found on the surface of the single crystal spinel film 20.

As a means for removing such a micro irregularity available is a micro processing technique for with use an beam using an ion beam milling device for etching ordinary semiconductor film etc.

Figure 7:
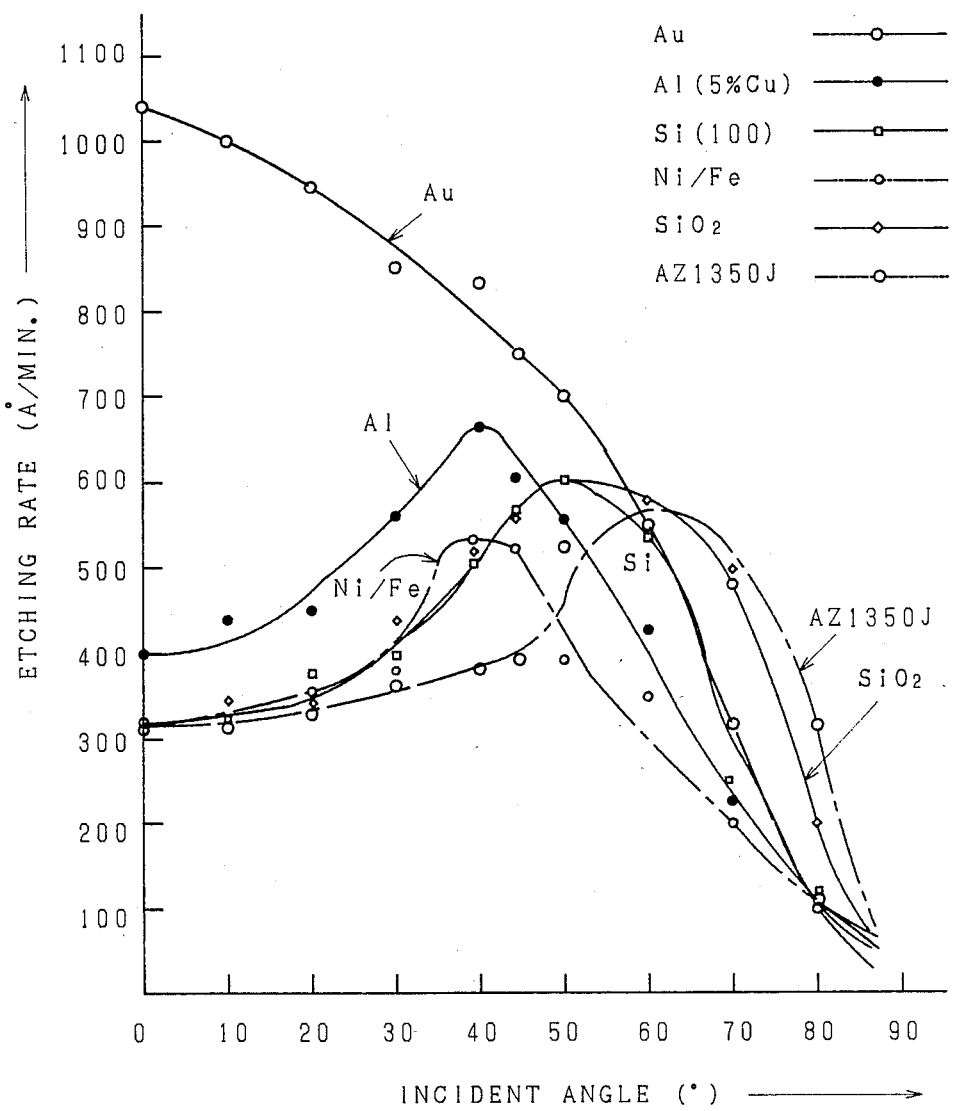
FIG. 7 is a graph showing the relationship between the incident angle of the ion beam and etching rate of various materials, FIGS. 8 (a)-(c) are electron micrographs showing the surface conditions of single crystal spinel films when the ion beam incident angle is 60°, 85° and 87.5°, respectively.

The relationship between the incident angle of the ion beam to the normal direction of the material surface and the etching rate is, according to the catalogue data announced by American Commonwealth Co., as shown in FIG. 7, that most substances are etched at the ion beam incident range 0–80°, and when the incident angle is larger than 80°, the etching rates of most substances rapidly decrease and little etching is attained.

In the method of the present invention, accordingly, while revolving a substrate 1 with a spinel film 20 formed thereon in a horizontal plane, the spinel film 20 is irradiated with an argon (Ar) ion beam (IB) at an incident angle of 80° or more to the normal direction of the surface of the spinel film 20, to remove the micro irregularity on the surface of the spinel film 20 by etching. Thus the surface of the spinel film 20 is smoothed without any contamination or peeling of the spinel film 20, unlike the conventional polishing method.

A specific method of argon ion beam irradiation is as follows: Ionized argon gas $Ar^+$ is extracted from the extraction out electrode, neutralized by a neutralizer (filament), and Ar atom is irradiated onto the spinel film 20.

Figure 8:
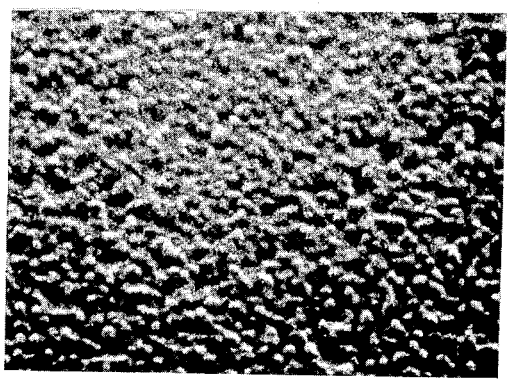
Figure 8:
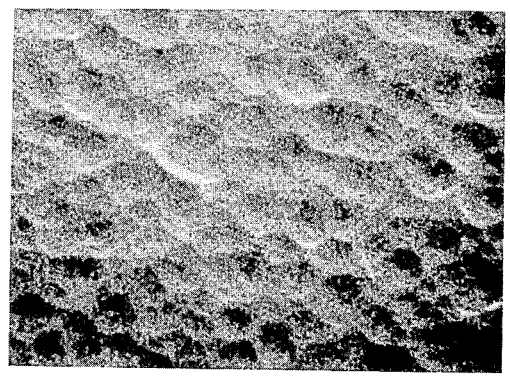
Figure 8:
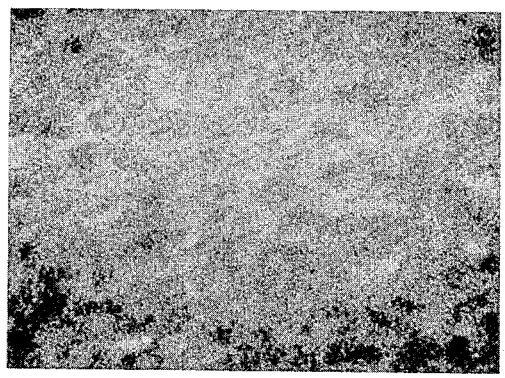

With the energy of the argon ion beam IB set to 500 eV and the current density at 1.4 mA/cm$^2$, and with the angle of incident angle $\theta$ set to 60°, 85°, and 87.5°, the electron micrographs of the surface conditions of the spinel film 20 are as shown in FIGS. 8 (a), (b), and (c), respectively. As shown in FIG. 8 (a), a surface irregularity is still found on the spinel film 20 when the incident angle is 60°, while as shown in FIG. 8 (b), when $\theta = 85°$; surface irregularity is hardly observed, with a fairly smooth surface; when $\theta = 87.5°$, the surface is more smooth as shown in FIG. 8 (c). Thus, when $\theta$ is about 85° or more, smooth surfaces of the spinel film 20 can be obtained. Such spinel film 20 allows the formation of a quality single crystal silicon film thereon, free of degradation.

If the incident angle $\theta$ is 75° or 80°, the surface of the spinel film is naturally more smooth than the case of $\theta = 60°$, but as described above, a single crystal silicon film of a sufficient quality for practical use cannot be obtained; such angles are also not suitable to the smoothing of a thin film surface from the point of the etching rate. Thus, the smoothing of the surface of the spinel film 20 is effectively attained by using the incident angle $\theta$ of about 85° or more.

Figure 9:
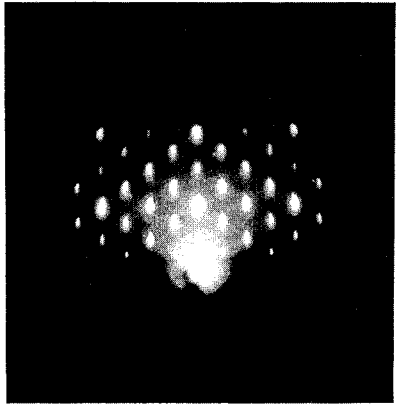
FIG. 9 is a table showing the characteristics of the single crystal spinel film, FIG. 10 (a)-(e) are electron micrographs showing the surface conditions of the single crystal spinel films when the revolution number is varied.
Figure 9:
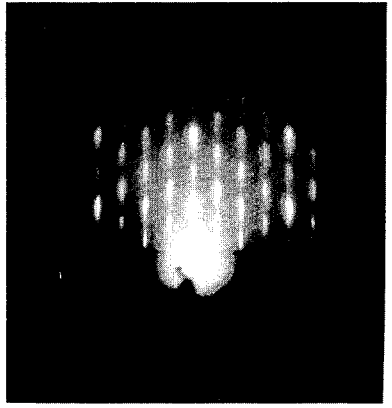

An evaluation of the spinel film quality after ion beam irradiation is shown in FIG. 9. In FIG. 9, an evaluation of spinel film quality before ion beam irradiation is also shown as a reference. It is found in the reflected high energy electron beam diffraction pattern (RHEED) that the spinel film after etching shows elongated spot pattern indicating that conversion into amorphous state has not occurred and the surface is smooth. The X-ray diffraction pattern indicates that the etching has decreased the film thickness leading to decreased diffraction intensity and that the rocking-curve half width is slightly increased. The larger Mg composition before etching is because a layer containing more Mg is present at the surface when the spinel film grows. No change in Mg/Al composition ratio is found before and after etching. No change in Al, Mg, O electron binding energy is found before and after etching and it is found that no conversion into amorphous state has occurred.

Thus, the spinel film smoothed by the method of the invention has received no damage by the ion beam irradiation. The method according to the invention can smooth the spinel film without damaging the spinel film.

Figure 10:
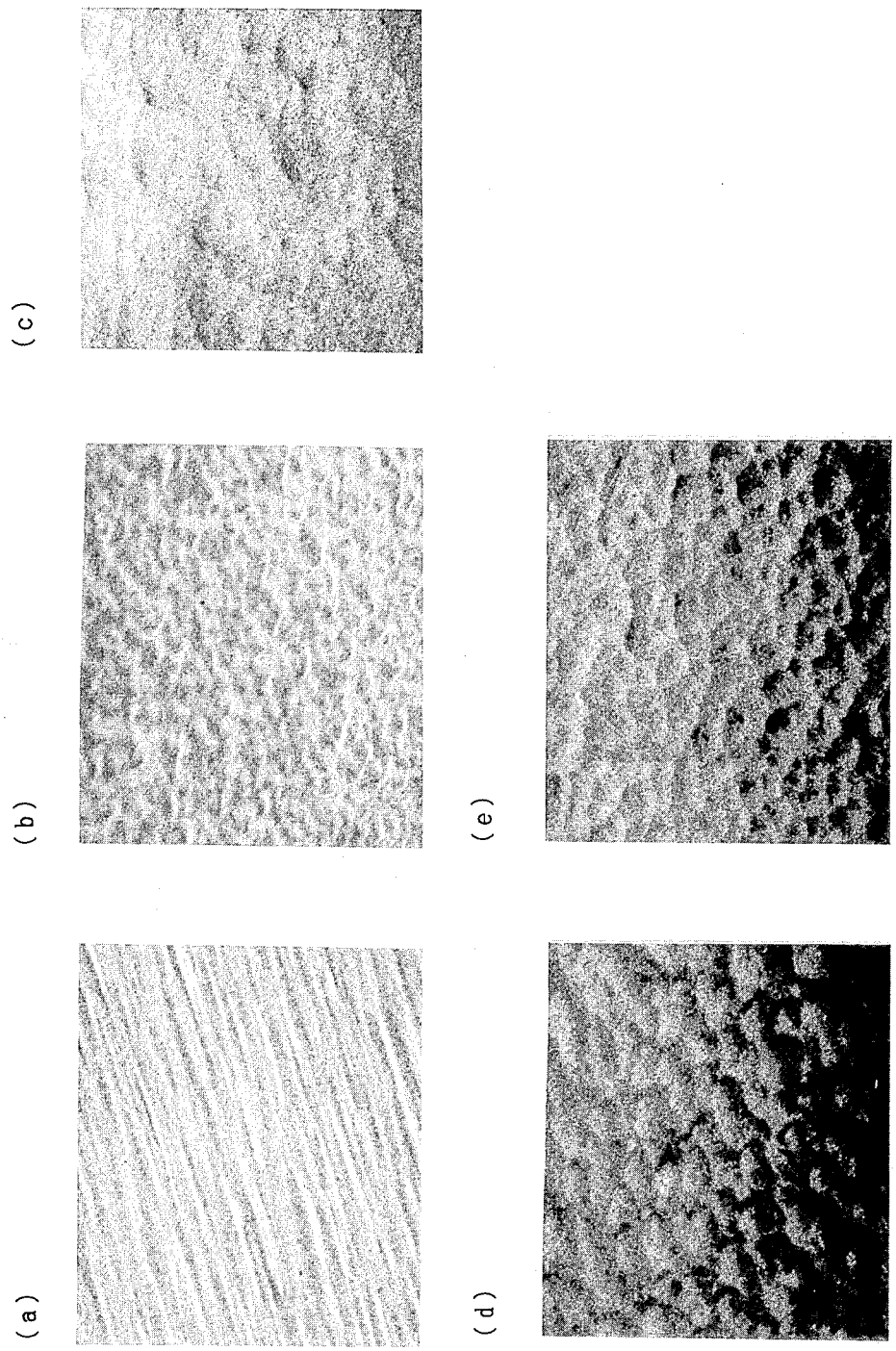

The, revolving number of the substrate governs the degree of smoothness when the smoothing treatment is given by ion beam irradiation. FIGS. 10 (a)-(e) are electron micrographs of the surface of the spinel film after being irradiated while revolving in the conditions shown in Table 1.

TABLE 1

| | Revolving speed (rpm) | Etching time (min.) | Total number of revolution (turn) |
|---|---|---|---|
| (a) | 0 | 16 | 0 |
| (b) | 1/16 | 10 | 0.6 |
| (c) | 1/16 | 16 | 1 |
| (d) | 1/6 | 16 | 2.7 |
| (e) | 1 | 16 | 16 |

From FIG. 10, it is understood that when the total number of revolution is one turn or more, the surface of the spinel film after etching is smooth. In the condition of 500 eV in ion energy and 1.4 mA/cm$^2$ in current density, when the number of revolution is satisfactorily large (4 rpm), etching treatment in 10 min. can give the spinel film satisfactory smoothness. From these facts, conditions required for smoothing are: etching time is 10 min. or more and the substrate is revolved at least one turn during this period.

The, specific method of forming an SOI substrate by using the above smoothing method is described.

Figure 1:
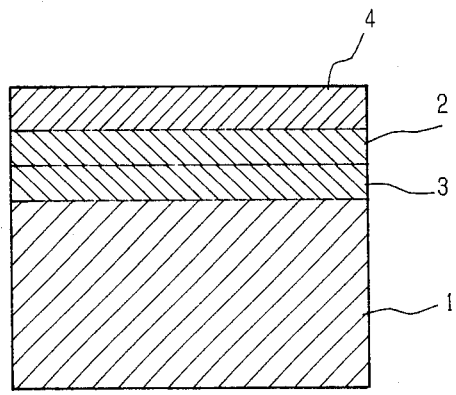
FIG. 1 is a sectional view of an SOI substrate according to the invention.

A round single crystal (100) silicon substrate of 3 in. in diameter shown in FIG. 1 is accommodated in the reaction chamber of an Al—HCl—MgCl$_2$—CO$_2$—H$_2$ series vapor phase epitaxial growth device, and is held at 920° C. to grow a single crystal magnesia spinel film 2 on the silicon substrate 1 to a thickness of 200 nm.

Then, the magnesia spinel film 2 grown on the silicon substrate 1 is annealed at a temperature of 1200° C. in an oxygen atmosphere for 2 hr., to oxidize the interface of the magnesia spinel film 2 and the silicon substrate 1, through the magnesia spinel film 2, and form an oxidized silicon film 3.

Figure 2:
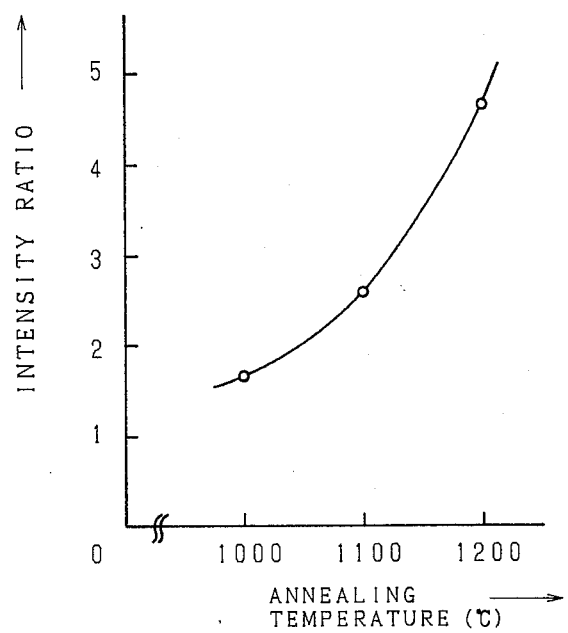
FIG. 2 is a graph showing the relationship between the annealing temperature and the X-ray diffraction intensity of a single crystal magnesia spinel film formed on the single crystal silicon substrate by the VPE method.

Here, annealing at as high as 1200° C. remarkably heightens the crystallinity of the magnesia spinel film 2, as obvious from FIG. 2, but on the contrary it can cause a roughness or deteriorated crystalline structure of the surface of the magnesia spinel film 2 as described above.

To improve the surface characteristics of such magnesia spinel film 2, by the ion beam milling device, the surface of the magnesia spinel film 2 is irradiated with an argon (Ar) ion beam at an angle of 85° or more to the normal direction of the surface thereof, about 20 nm in the depth direction at a rate of 2 nm/min., for about 10 min. to attain flatness of the surface.

Figures 3, 4:
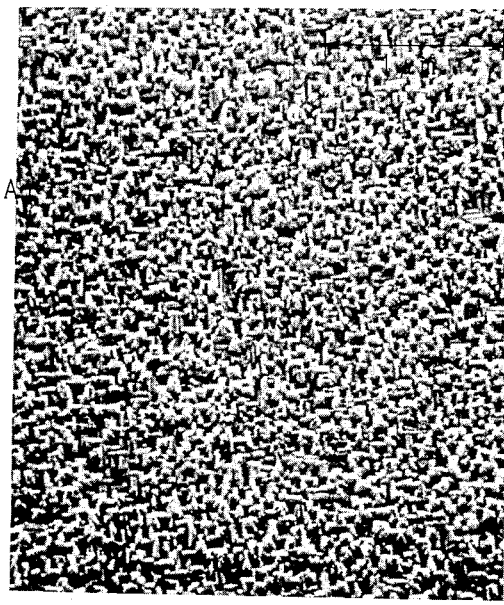
FIG. 3 is an electron micrograph showing the surface condition of a single crystal magnesia spinel film formed by the conventional method.
FIG. 4 is a reflected high energy electron beam diffraction pattern photograph showing crystalline structure of the surface of the single crystal magnesia spinel film formed by the conventional method.
Figure 11:
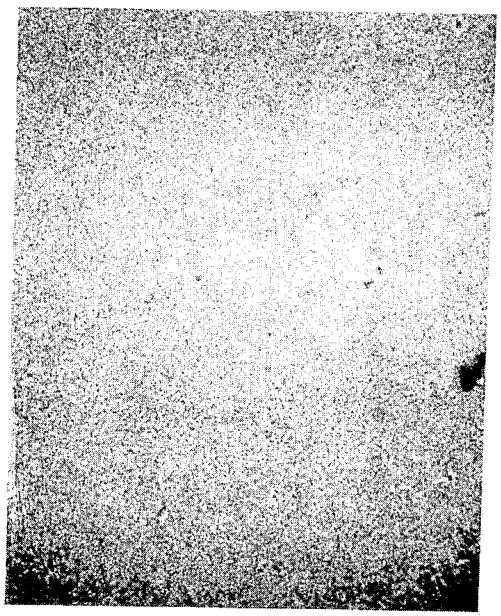
FIG. 11 is an electron micrograph showing the surface condition of the single crystal magnesia spinel film in the method of forming an SOI substrate according to the invention.
Figure 12:
FIG. 12 is a reflected high energy electron beam diffraction pattern showing the crystalline structure of the surface of the single crystal magnesia spinel film in the method of forming an SOI substrate according to the invention.

The surface conditions of the magnesia spinel film 2 after ion beam etching is shown in the electron micrograph in FIG. 11. As obvious from the comparison with the electron micrograph in FIG. 3, showing the surface condition of the single crystal magnesia spinel film by conventional method, the ion beam etching has removed the surface roughness of the magnesia spinel film 2 to flatten the surface. In addition, the reflected electron beam diffraction pattern showing the surface crystalline structure of the magnesia spinel film etched becomes a streak pattern showing a single crystal pattern as in FIG. 12. This indicates that the ion beam etching has remarkably improved the surface characteristics of the magnesia spinel film 2.

On the flattened magnesia spinel film 2, a single crystal silicon film 4 is epitaxially grown by a monosilane (SiH$_4$)thermal decomposition method at a temperature of 950° C. to a thickness of 2μm to form an SOI substrate.

The crystallinity of the silicon film 4 thus grown on the magnesia spinel film 2 etched by the ion beam is evaluated by measuring the full width at half-maximum (FWHM) of the rocking curve of silicon (422)X-ray diffraction. The FWHM is 0.10°. A comparison is made, between a single crystal silicon film (A silicon film) grown on a single crystal magnesia spinel film which has not been subjected to ion etching, and has been annealed in the same condition, and, a single crystal silicon film (B silicon film) grown on a single crystal magnesia spinel film which has not been subjected to the ion beam etching ad has been annealed at 1100° C. which, are both measured in silicon (422) X-ray diffraction pattern rocking curve. The FWHM of the silicon film are 0.35° ( A silicon film ) and 0.20° ( B silicon film ), respectively wich is fairly larger than the above FWHM.

This is considered to be due to the high annealing temperature (1200° C.) in A silicon film. Since the single crystal silicon film is grown on the roughened magnesia spinel film, the quality of silicon film 4 is dropped. In the case of B silicon film, though the annealing temperature is rather low and the roughening is rather small, the increase of crystallinity of the magnesia spinel film is unsatisfactory and the satisfactory single crystal silicon film is not formed.

Table 2 shows the characteristics of n-MOS FET (FET(a)) formed on the SOI substrate (single crystal silicon film) by the method of forming SOI substrate according to the invention. In the same Table 2, the characteristics of n-MOS FET (FET(b)) which is formed on the SOI substrate in the same conditions except that the magnesia spinel has not received ion beam etching, are provided for reference.

TABLE 2

| | $\mu_{FEM}$ (cm$^2$/Vsec) | $I_{dsc}$ (pA/μm) | S (mV/dec) |
|---|---|---|---|
| FET (a) | 660 | 15.5 | 146 |
| FET (b) | 337 | 33.4 | 421 |

As understood from Table 2, the n-MOS FET (FET(a)) formed on the SOI substrate by the method according to the invention has excellent characteristics. This is due to the improved crystallinity of the single crystal silicon film accompanied by the smoothing treatment of the magnesia spinel film.

While In this embodiment the annealing is made in an oxygen atmosphere, the annealing may be made in another oxidizing atmosphere such as a nitrogen atmosphere containing water vapor (wet nitrogen).

In this specification, an embodiment in which an insulating film such as a spinel film is irradiated with ion beam, to smooth the surface described, but the invention is not limited to this.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the meets and bounds of the claims, or equivalence of such meets and bounds thereof are therefore intended to be embraced by the claims.

What is claimed is:

1. A surface smoothing method for smoothing the surface of an object having an irregularity, said object being a spinel layer or a thin spinel film layer of a semiconductor, the method comprising irradiating the surface of said object with an ion beam at an incident angle of about 85° or more to the normal direction of the surface while revolving said object.

2. A surface smoothing method as claimed in claim 1, wherein said ion beam is an argon ion beam.

3. A surface smoothing method as claimed in claim 1, wherein said incident angle is about 87.5° or more.

4. A surface smoothing method as claimed in claim 1, wherein said object further comprises a substrate with a semiconductor thin spinel film formed thereon.

5. A surface smoothing method as claimed in claim 4, wherein said substrate is a single crystal silicon strate.

6. A surface smoothing method as claimed in claim 1, wherein said object is a substrate with a spinel insulating film formed thereon.

7. A surface smoothing method as claimed in claim 6, wherein said substrate is a single crystal silicon substrate.

8. A surface smoothing method as claimed in claim 1, wherein said object is revolved at least one turn while the object is irradiated with the ion beam.

9. A surface smoothing method as claimed in claim 1, wherein said spinel film is a magnesia spinel film.

10. A method of forming an SOI substrate comprising a single crystal spinel insulating film and a single crystal silicon film laminated on a single crystal silicon substrate, in this order, wherein after said single crystal insulating film is formed on said single crystal silicon substrate, the surface of said single crystal insulating film is irradiated with an ion beam to smooth the surface and thereafter said single crystal silicon film is formed thereon, said insulating film being irradiated with said ion beam at an incident angle of about 85 degrees or more to the normal direction of the surface, said single crystal silicon substrate with said single crystal insulating film formed thereon being revolved while said insulating film is irradiated with said ion beam.

11. A method of forming an SOI substrate as claimed in claim 10, wherein said single crystal silicon substrate is revolved at least one turn during the ion beam irradiation.

12. A method of forming an SOI substrate as claimed in claim 10, wherein a process for annealing said single crystal insulating film is inserted between the process for forming said single crystal insulating film and the process for irradiating with said ion beam.

13. A method of forming an SOI substrate as claimed in claim 12, wherein said single crystal insulating film is annealed in an oxidizing atmosphere.

14. A method of forming an SOI substrate as claimed in claim 13, wherein said oxidizing atmosphere is a nitrogen atmosphere containing water vapor.

15. A method of forming an SOI substrate as claimed in claim 13, wherein said oxidizing atmosphere is an oxygen atmosphere.

16. A method of forming an SOI substrate as claimed in claim 12, wherein said single crystal insulating film is annealed at a temperature higher than 900° C.

17. A method of forming an SOI substrate as claimed in claim 16, wherein the annealing temperature is higher than 1200° C.

18. A method of forming an SOI substrate as claimed in claim 10, wherein said single crystal insulating film is a single crystal magnesia spinel film.

19. A method of forming an SOI substrate as claimed in claim 10, wherein said single crystal insulating film is formed by the vapor-phase epitaxial growth method.

20. A method of forming an SOI substrate as claimed in claim 10, wherein said single crystal silicon film is formed by the epitaxial growth method.

21. A method of forming an SOI substrate as claimed in claim 10, wherein said ion beam is an argon ion beam.

22. A method of forming an SOI substrate as claimed in claim 10, wherein the incident angle is about 87.5° or more.

* * * * *